United States Patent
Kwon et al.

(10) Patent No.: US 7,838,908 B2
(45) Date of Patent: Nov. 23, 2010

(54) SEMICONDUCTOR DEVICE HAVING DUAL METAL GATES AND METHOD OF MANUFACTURE

(75) Inventors: Unoh Kwon, Fishkill, NY (US); Siddarth A. Krishnan, Peekskill, NY (US); Takashi Ando, Tuckahoe, NY (US); Michael P. Chudzik, Danbury, CT (US); Martin M. Frank, Dobbs Ferry, NY (US); William K. Henson, Beacon, NY (US); Rashmi Jha, Toledo, OH (US); Yue Liang, Beacon, NY (US); Vijay Narayanan, New York, NY (US); Ravikumar Ramachandran, Pleasantville, NY (US); Keith Kwong Hon Wong, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 10 days.

(21) Appl. No.: 12/359,520

(22) Filed: Jan. 26, 2009

(65) Prior Publication Data

US 2010/0187610 A1    Jul. 29, 2010

(51) Int. Cl.
*H01L 27/10* (2006.01)
(52) U.S. Cl. ................ 257/204; 257/351; 257/371; 257/388; 257/412; 257/E27.062
(58) Field of Classification Search ............ 257/204, 257/274, 351, 371, 383, 388, 412
See application file for complete search history.

(56) References Cited

U.S. PATENT DOCUMENTS

| 6,894,353 | B2 |  | 5/2005 | Samavedam et al. |
| 6,972,224 | B2 |  | 12/2005 | Gilmer et al. |
| 6,974,764 | B2 |  | 12/2005 | Brask et al. |
| 7,253,050 | B2 | * | 8/2007 | Luan et al. ............ 438/232 |
| 7,432,567 | B2 | * | 10/2008 | Doris et al. ............ 257/407 |
| 2005/0106788 | A1 | * | 5/2005 | Amos et al. ............ 438/152 |
| 2006/0289920 | A1 | * | 12/2006 | Wu et al. ............ 257/310 |
| 2008/0188044 | A1 |  | 8/2008 | Hsu et al. |
| 2008/0272433 | A1 |  | 11/2008 | Alshareef et al. |

OTHER PUBLICATIONS

R. Ramachandran, et al.—"Method of Forming Gate Stack and Structure Thereof"—filed Jan. 5, 2009—U.S. Appl. No. 12/348,332.
M. Chudzik, et al.—High-K/Metal Gate Stack Using Capping Layer Methods, IC and Related Transistors—filed Dec. 12, 2007—U.S. Appl. No. 11/954,749.

\* cited by examiner

*Primary Examiner*—Wai-Sing Louie
(74) *Attorney, Agent, or Firm*—Joseph P. Abate

(57) ABSTRACT

A semiconductor device includes: a semiconductor substrate; a PFET formed on the substrate, the PFET includes a SiGe layer disposed on the substrate, a high-K dielectric layer disposed on the SiGe layer, a first metallic layer disposed on the high-k dielectric layer, a first intermediate layer disposed on the first metallic layer, a second metallic layer disposed on the first intermediate layer, a second intermediate layer disposed on the second metallic layer, and a third metallic layer disposed on the second intermediate layer; an NFET formed on the substrate, the NFET includes the high-k dielectric layer, the high-k dielectric layer being disposed on the substrate, the second intermediate layer, the second intermediate layer being disposed on the high-k dielectric layer, and the third metallic layer, the third metallic layer being disposed on the second intermediate layer. Alternatively, the first metallic layer is omitted. A method to fabricate the device includes providing $SiO_2$ and alpha-silicon layers or a dBARC layer.

14 Claims, 13 Drawing Sheets

SEMICONDUCTOR DEVICE HAVING DUAL METAL GATES AND METHOD OF MANUFACTURE

FIELD OF THE INVENTION

The invention relates to semiconductor devices and, more particularly, to complementary metal oxide semiconductor (CMOS) devices with dual-metal gate structures and fabrication methods therefor.

DESCRIPTION OF THE PRIOR ART

The introduction of metal gates and high-k gate dielectrics in the advanced CMOS devices requires the integration of dual gate dielectrics and dual metal gates to achieve target CMOS performance. However, the integration of dual dielectrics and dual metal gates introduces additional lithography steps and process complexities which increase the cost of manufacturing.

The integration of semiconductor transistors having dual work function metal gates, however, is troublesome. For example, it is difficult to manipulate the work function of metals.

Dual work function gates are advantageously used in semiconductor devices having both PMOS and NMOS transistors. Some work functions that enable optimal operation of both PMOS and NMOS transistors are required. The optimal work function for a metal gate electrode will differ depending upon whether it is used to form an NMOS transistor or a PMOS transistor. For this reason, when the same material is used to make metal gate electrodes for NMOS and PMOS transistors, the gate electrodes do not demonstrate the desired work function for both types of devices. It may be possible to address this problem by separately forming metal gate electrode of the NMOS transistor from a first material and metal gate electrode of the PMOS transistor from a second material. The first material may ensure an acceptable work function for the NMOS gate electrode, while the second material may ensure an acceptable work function for the PMOS gate electrode.

FIG. 1 is a cross section of a conventional CMOS transistor incorporating dual metal gate structures thereon. The CMOS transistor includes a PMOS transistor region 10P that is typically formed in an n-well (not shown) and an NMOS transistor region 10N that is formed in a p-well (not shown). The substrate 1 has a first well of the first conductivity type and a second well of the second conductivity type. The first well and the second well are isolated from one another by shallow trench isolation (STI) 13 in the substrate to separate PMOS transistor region 10P from NMOS transistor region 10N. A gate dielectric 15 is deposited on the surface of the semiconductor substrate 1 over both the PMOS transistor region 10P and the NMOS transistor region 10N. As suggested above, CMOS transistor also incorporates a dual-metal gate conductor in the form of a first metal gate conductor 16a and a second metal gate conductor 16b. First metal gate conductor 16a is deposited and formed on gate dielectric 15 over PMOS region 10P. Second metal gate conductor 16b is separately deposited and formed on gate dielectric 16b over NMOS region 10N. Polysilicon electrode 17 is deposited and formed on the first and second metal gate conductors 16a and 16b. Known processes for forming such dual metal gate devices may, however, be complex and expensive.

Methods for fabricating a semiconductor device having a metal gate electrode are also disclosed in, for example, U.S. Pat. No. 6,974,764, the entirety of which is hereby incorporated by reference. That method comprises forming a dielectric layer on a substrate, and forming a first metal layer on a first part of the dielectric layer, leaving a second part of the dielectric layer exposed. After a second metal layer is formed on both the first metal layer and the second part of the dielectric layer, a masking layer is formed on the second metal layer.

See also U.S. Pat. No., 6,974,764, "Method For Making A Semiconductor Device Having A Metal Gate Electrode", filed on Nov. 6, 2003, by Brask, et al., U.S. Pat. No. 6,972,224B2, "Method For Fabricating Dual-Metal Gate Device", filed on Mar. 27, 2003, by Gilmer, et al. and U.S. Patent Application Publication No. U.S. 2008/01888044A1, "Semiconductor Devices With Dual-Metal Gate Structures And Fabrication Methods Thereof", filed on Apr. 9, 2008, by Hsu et al., which are all incorporated in their entireties by reference herein.

BRIEF SUMMARY OF THE INVENTION

Accordingly the present invention is directed to a semiconductor device having dual metal gates and a high-k gate dielectric that is cost effective, compatible with CMOS processing technology, and permits enhancing both NFET and PFET performance through tuning with metallic materials/layers having desirable work functions. The present invention is directed also to a method of manufacturing such a device. An NFET region includes La or $La_2O3$ and a PFET region further includes SiGe and Al or $Al_2O_3$ and La or $La_2O_3$.

BRIEF DESCRIPTION OF THE DRAWINGS

FIGS. 2A-9 are side-sectional schematic views (not to scale) showing the steps of fabricating a semiconductor device having dual metal gate structures according to a preferred embodiment of the present invention.

DETAILED DESCRIPTION AND PREFERRED EMBODIMENTS OF THE INVENTION

The present invention is directed to a semiconductor device and a method for fabricating such device.

Figure 1:
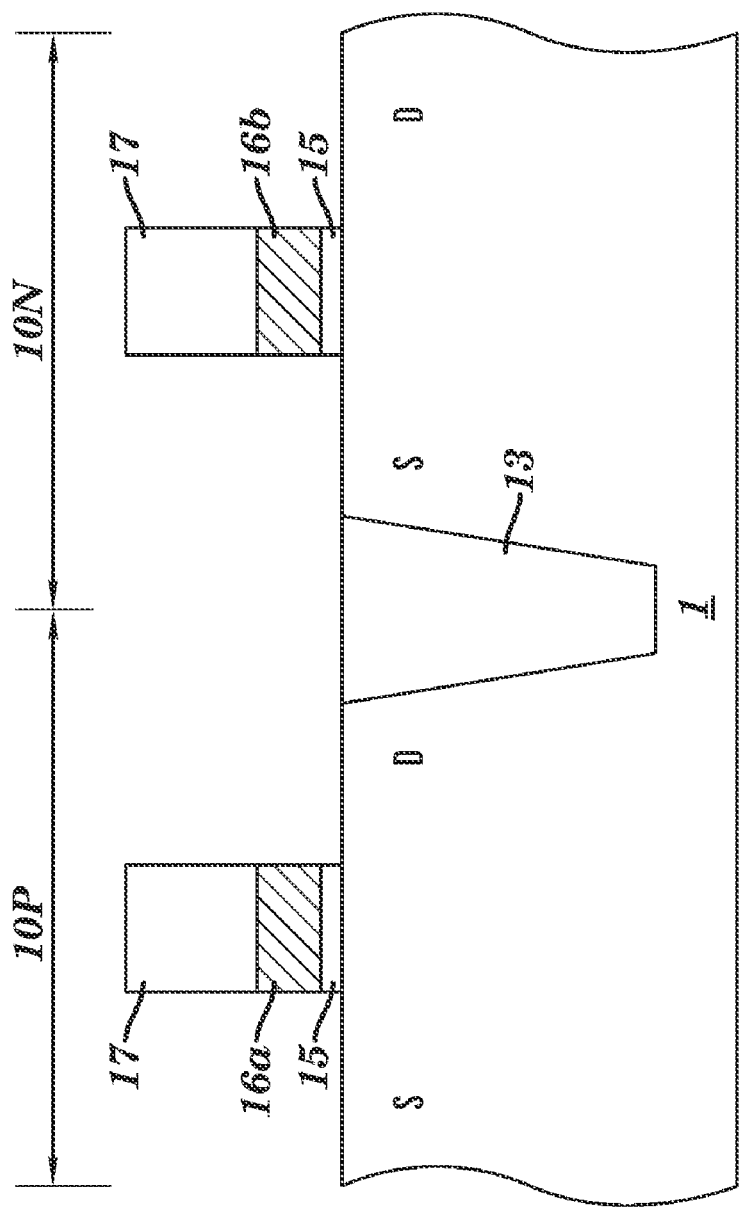
FIG. 1 is a side-sectional schematic view of a conventional CMOS transistor device having dual metal gate structures.
Figure 2A:
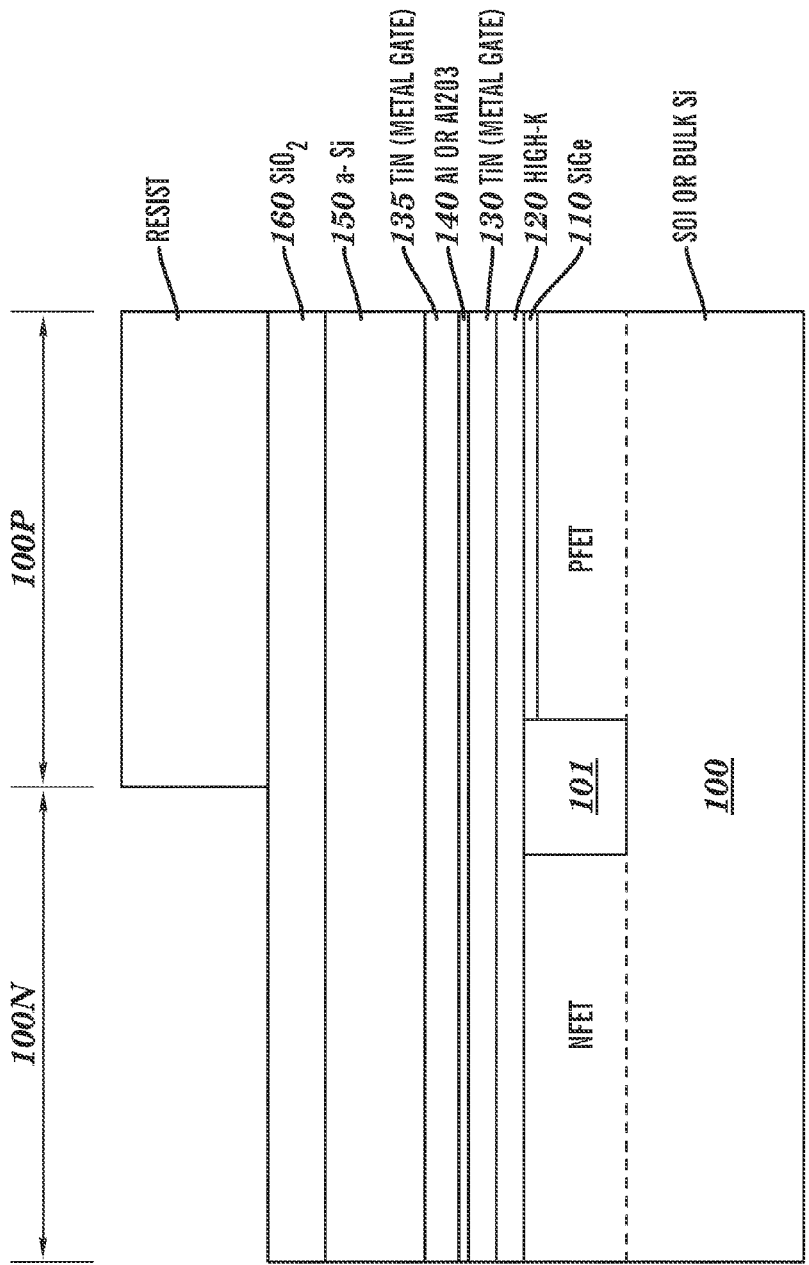

A preferred method for making a semiconductor device according to a preferred structural embodiment (FIG. 9) is shown sequentially with reference to FIGS. 2A-9. Effecting each step is well within one skilled in the art in view of the instant specification and drawing figures. Thus, only those aspects and features of the present invention necessary to practice the invention will be described in any detail. For a description of various CMOS fabrication technologies, see *VLSI Technology* by S. M. SZE (McGraw-Hill, 1988, ISBN 0-07-062735-5). See also the publications previously incorporated by reference. Step one of a first preferred embodiment of the present invention is shown in FIG. 2A. Alternative step ones of second, third and fourth preferred embodiments are shown respectively in FIGS. 2B, 2C and 2D.

Provide a NFET region 100N and a PFET region 100P, the NFET region and the PFET region including a substrate 100 having portions NFET, PFET doped for the NFET and the PFET, an isolation region 101 in the substrate, a SiGe layer 110 disposed in the PFET adjacent to the isolation region 101, a high-k dielectric layer 120 disposed on the SiGe layer and the substrate, a first metallic layer 130 disposed on the high-k dielectric layer 110, a first intermediate layer 140 including Al disposed on the first metallic layer, an alpha-Si layer 150 disposed on the second metallic layer; and an oxide layer 160 disposed on the alpha-Si layer.

Figure 2B:
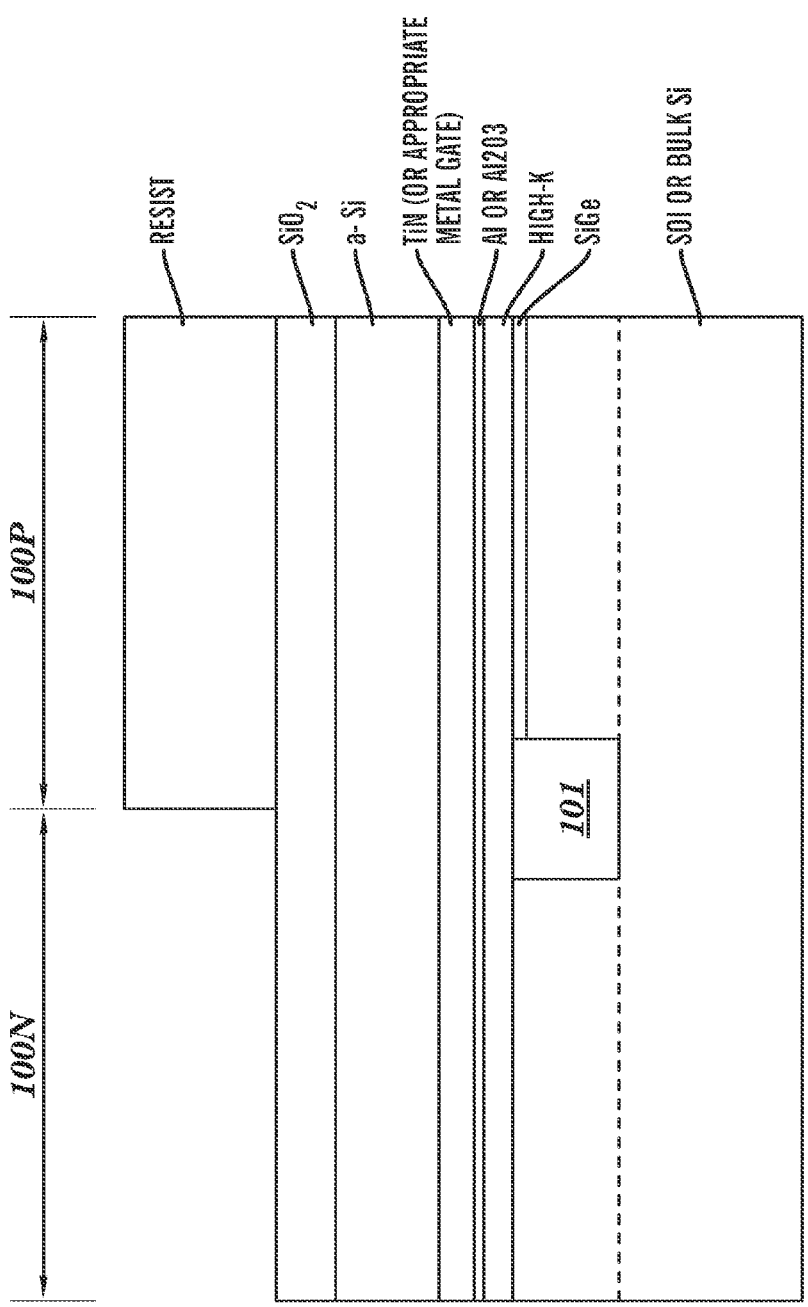
FIGS. 2B, 2C and 2D show side sectional schematic views (not to scale) of three alternative preferred embodiments of step one.
Figure 2C:
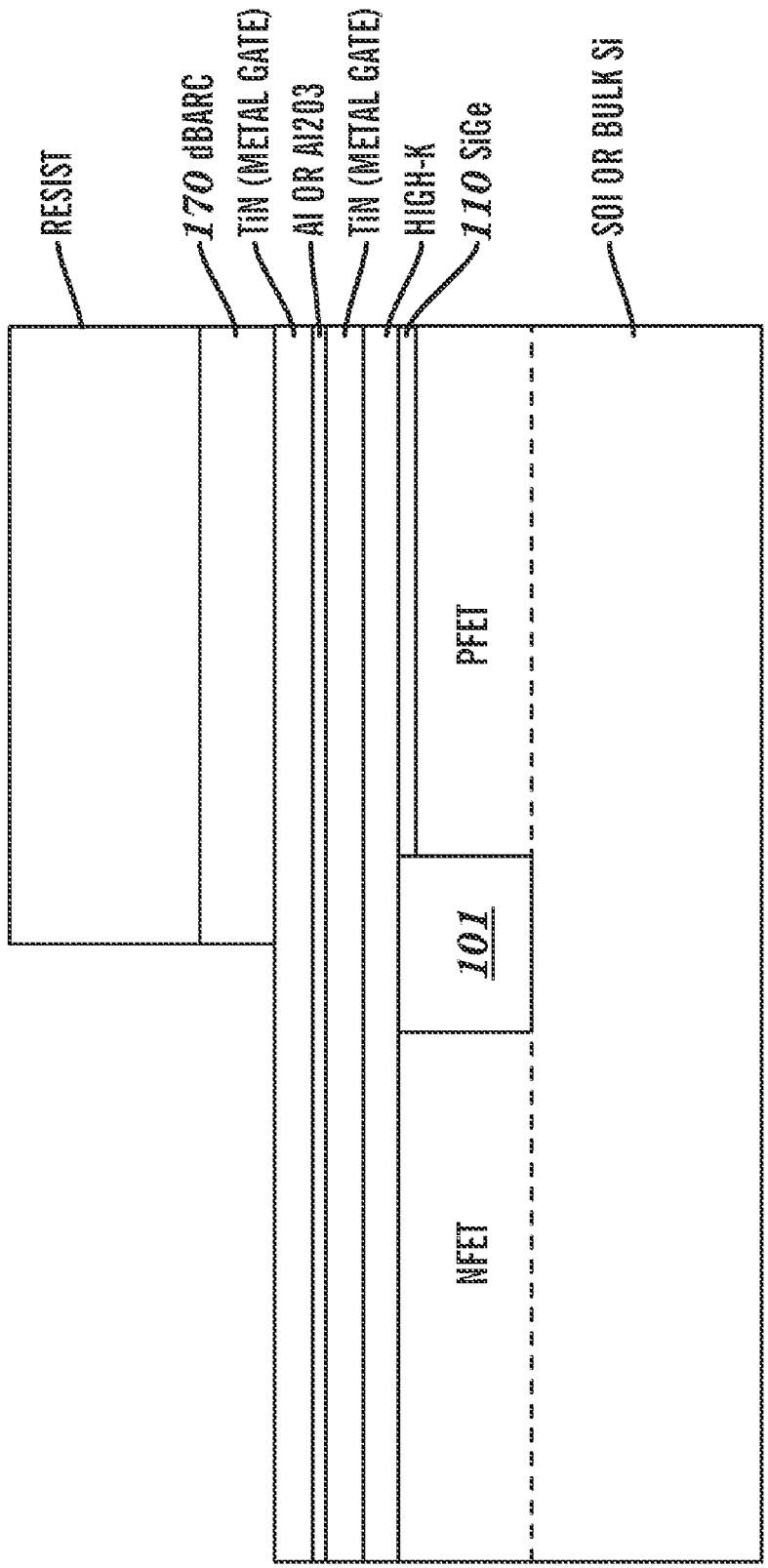

Alternatively, the layer 130 is omitted; See FIG. 2C. In a further alternative embodiment that seems particularly useful, the layers 150, 160 are replaced by a dBARC layer 170 as shown in FIG. 2B. The dBARC (developable antireflective coating) layer is commercially available and includes, for example an organic coating that has antireflective properties and has a thickness in a range of approximately 500 angstroms to approximately 1000 angstroms. For example, See FIG. 2C. However, the layer 170 could be thinner or thicker. See Also U.S. Pat. No. 7,432,567, "Metal Gate CMOS With At Least A Single Gate Metal, And Dual Gate Dielectrics", filed Dec. 28, 2005 by Doris, et al., which is incorporated in its entirety by reference herein. In a particularly useful fourth preferred embodiment, the layers 150, 160 are replaced by the dBARC layer 170 and the layer 130 is omitted; See FIG. 2D.

The substrate 100 indicates a bulk silicon, silicon-on-insulator (SOI) or other suitable substrate. The substrate 100 includes, e.g., a monocrystalline silicon substrate 100 doped to p-well for the NMOS region 100N and doped to an n-well for the PMOS region 100P all in a conventional manner. An isolation region 101 (e.g. STI) is formed between the NFET and the PFET as shown.

Next, the substrate 100 is etched conventionally in the PFET region 100P, and a SiGe layer 110 (e.g., channel layer) is grown conventionally. The layer 110 preferably has a substantially uniform thickness in a range from approximately (±10) five nm to approximately 15 nm. The amount of Ge is in a range of about 10% to about 50% and preferably from about 20% to about 40%. The layer 110 is disposed (e.g., grown) on the substrate 100 by, for example, any of the following techniques: CVD and ALD. The SiGe layer benefits the PMOS region such as by permitting a low Vt.

Appropriate respective source and drain regions are then formed in the portions NFET, PFET and layer 110 in a well known manner. FIGS. 2A-2D show also a high-k dielectric layer 120 disposed (e.g., deposited) on the SiGe layer 110 and the substrate portion NFET. The layer 120 includes a material having a dielectric constant K>1. The high-k dielectric layer 120 is, for example, hafnium oxide ($HFO_2$), aluminum oxide ($Al_2O_3$), lanthanum oxide ($La_2O_3$), hafnium silicon oxide (HfSiOx), hafnium silicon oxynitride (HfsiOn), zirconium oxide (ZrO), titanium oxide ($TiO_2$), tantalum oxide ($Ta_2O_5$), zirconium silicon oxide (ZrSiO), yttrium oxide ($Y_2O_3$) strontium oxide (SrO), or strontium titanium oxide (SrTiO), or mixtures thereof. Deposition techniques for each of the layers 110-170 include any of the following as appropriate and understood by one skilled in the art in view of the instant disclosure: CVD, LPCVD, PECVD, SACVD, HDPCVD, RTCVD, UHCCVD, LRPCVD, MOCVD, sputtering deposition, ion beam deposition, electron beam deposition, laser assisted deposition, thermal oxidation, thermal nitridation, spin-on methods, PVD, ALD, chemical oxidation, MBE, plating and/or evaporation.

In FIG. 2A, a first metallic layer 130 is deposited onto the layer 120. The layer 130 is, for example, TiN, TaC, TaN or TaCN and has a substantially uniform thickness in a range from approximately 5 angstroms to approximately 100 angstroms. TiN is preferred. A first intermediate layer 140 is deposited onto the layer 130. The layer 130 prevents material 140 from being incorporated into the layer 120. Alternatively, the layer 130 is omitted; See FIG. 2B. The layer 140 is, for example, Al or $Al_2O_3$. The layer 140 has a substantially uniform thickness in a range from approximately one angstrom to approximately 20 angstroms. A second metallic layer 135 is deposited onto the layer 140. The second metallic layer 135 is, for example, TiN, tantalum carbide, tantalum nitride or tantalum carbon nitride. The layer 135 has a substantially uniform thickness in a range of approximately 5 angstroms to approximately 100 angstroms, and preferably 10 angstroms to 80 angstroms.

A layer 150 including silicon is deposited onto the layer 135. The layer 150 is, for example, alpha-Si having a substantially uniform thickness in a range from about (∓10%) three (3) nm to about 30 nm.

An oxide layer 160 is disposed onto the layer 150. The layer 160 is, for example, $SiO_2$ having a substantially uniform thickness in a range from approximately 10 nm to approximately 40 nm, and preferably 10 nm to 30 nm.

Alternatively, the layers 150, 160 are omitted and replaced by a dBARC layer 170 which includes an organic coating which has antireflective properties and has a thickness in a range of approximately 500 angstroms to approximately 1000 angstroms; See FIG. 2C. The dBARC layer material is commercially available as would be well understood by those skilled in the art in view of the instant disclosure.

A particularly interesting embodiment includes the dBARC layer 170 and omits the metallic layer 130; See FIG. 2D.

The PFET and NFET regions 100P, 100N are then covered by a mask (e.g., resist) in any conventional fashion, and a portion of the mask in the NFET region 100N is then removed to expose the oxide layer 160.

Figure 3:
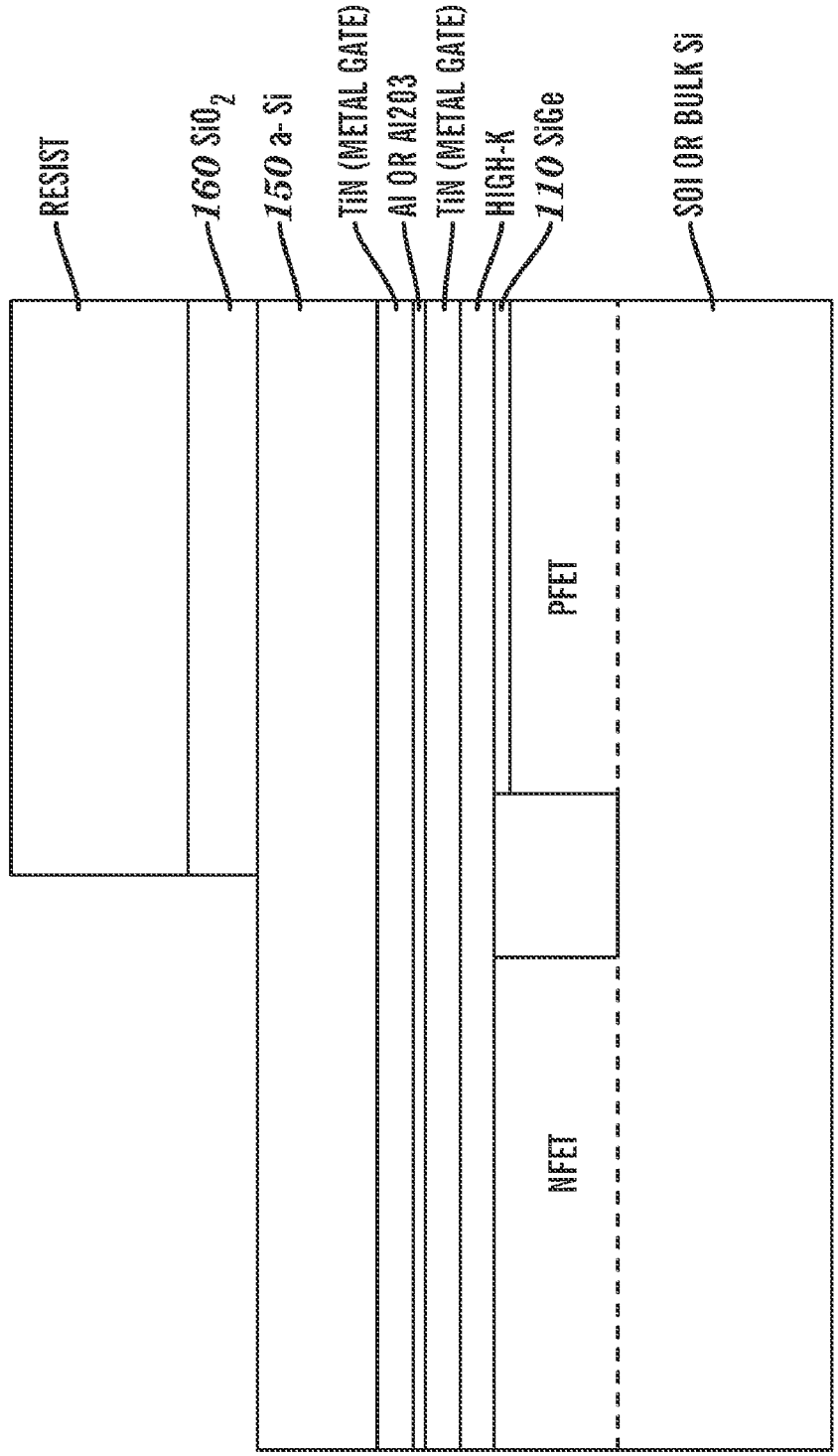
Figure 4:
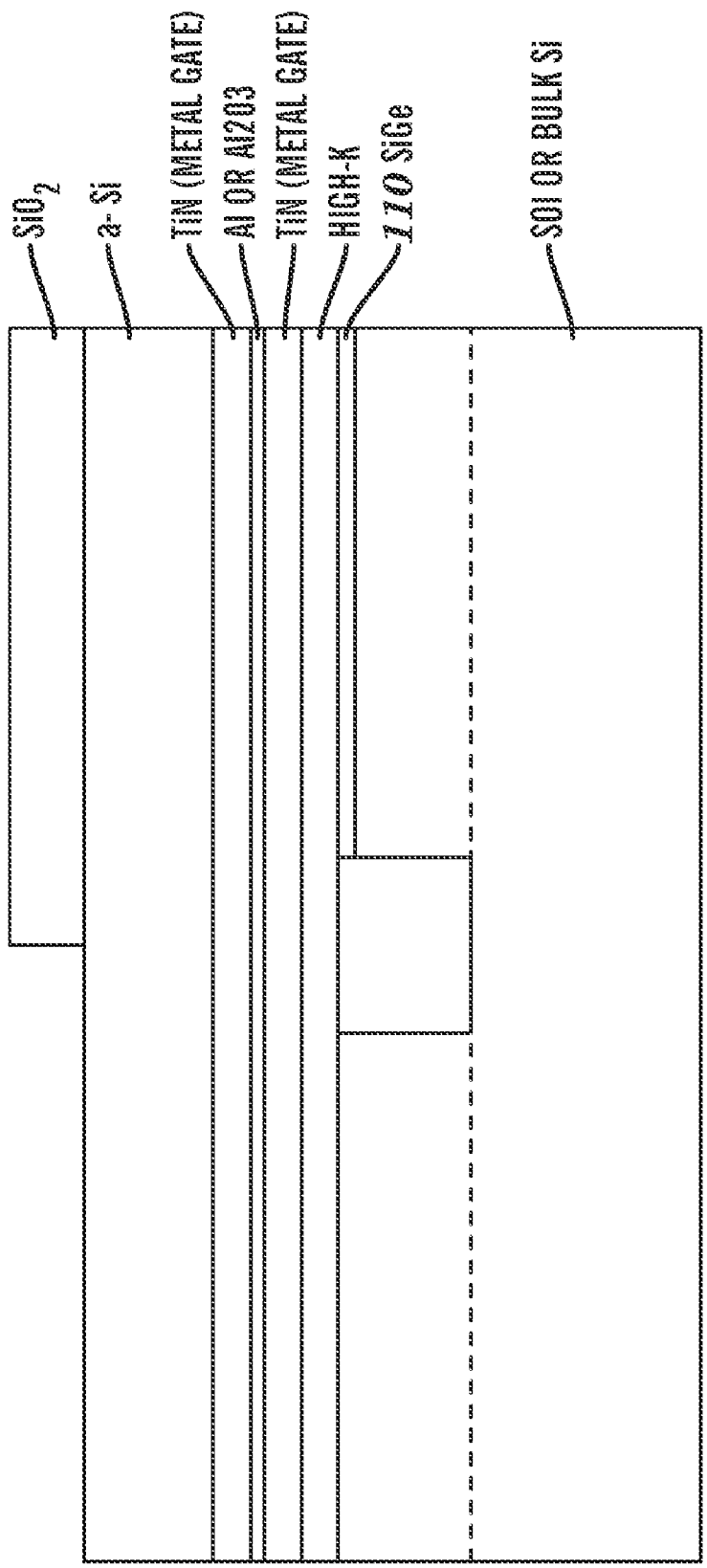

As now shown in FIG. 3, a portion of the layer 160 in the NFET region is removed by, for example, a suitable etch such as RIE or suitable wet chemistries to expose the layer 150.

The mask (e.g., resist) is removed (e.g., stripped) by a suitable etch such as RIE or appropriate wet chemistries; See FIG. 4.

Figure 5:
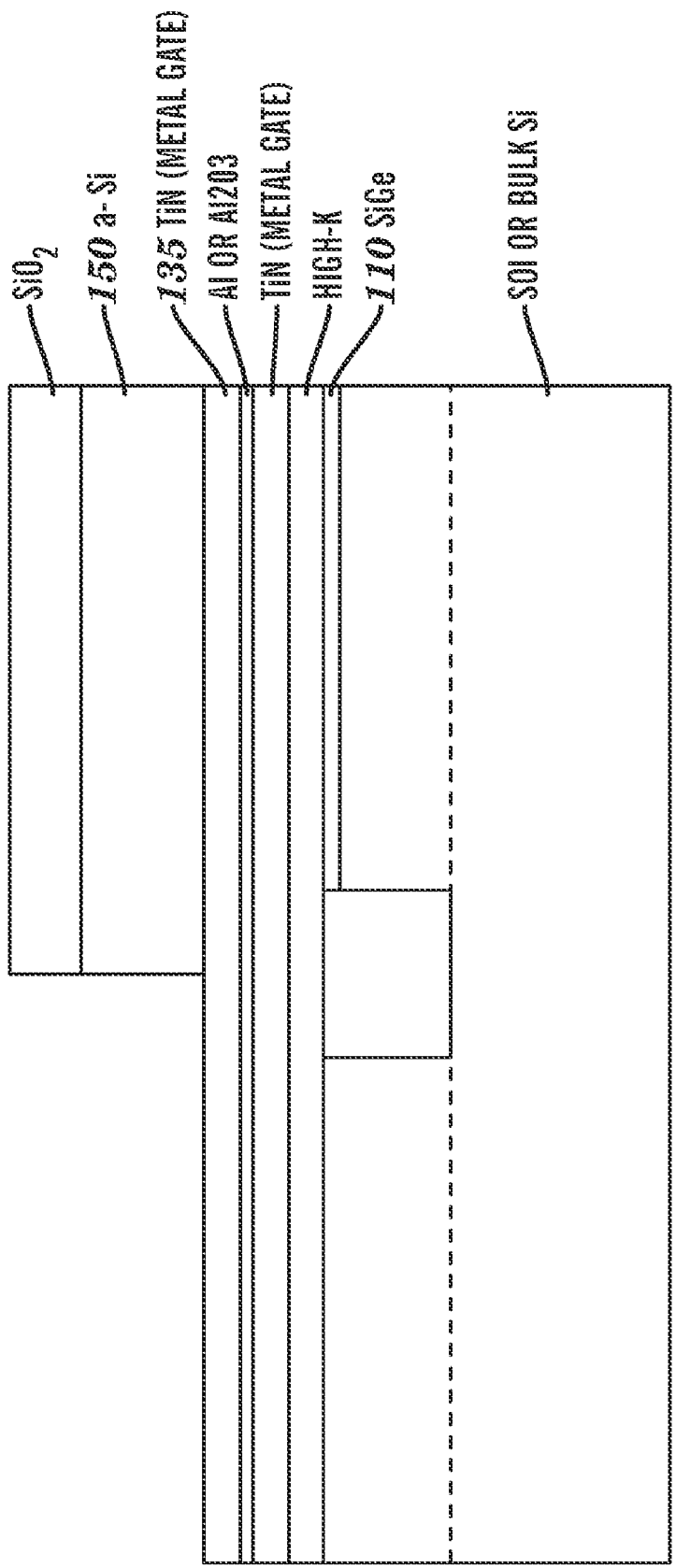

As shown in FIG. 5, a portion of the layer 150 (e.g. a-Si) is removed from the NFET region 100N to expose the layer 135. The layer 150 is removed, for example, by an appropriate wet or dry etch, such as $NH_4OH$, TMAH or RIE, respectively.

Figure 6:
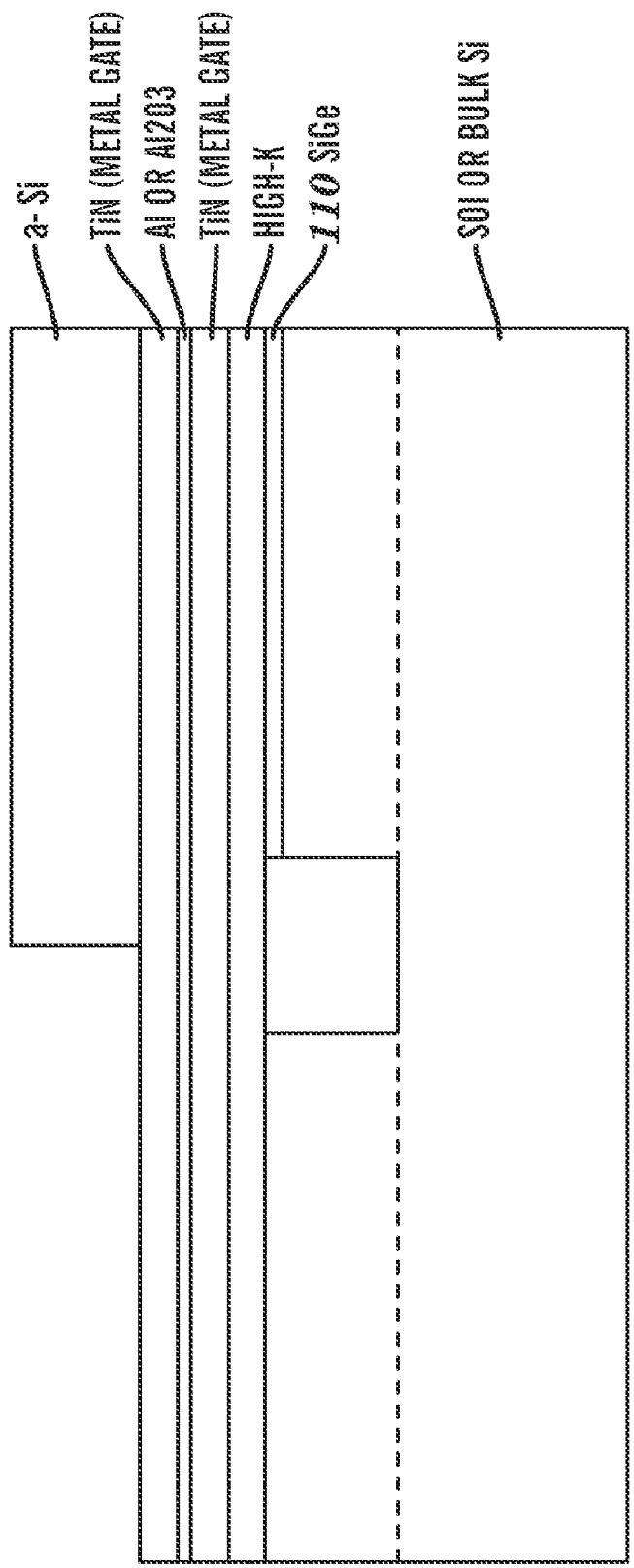

In FIG. 6, the layer 160 (e.g., $SiO_2$) is removed, for example, by wet etch with, e.g., HF.

Figure 7:
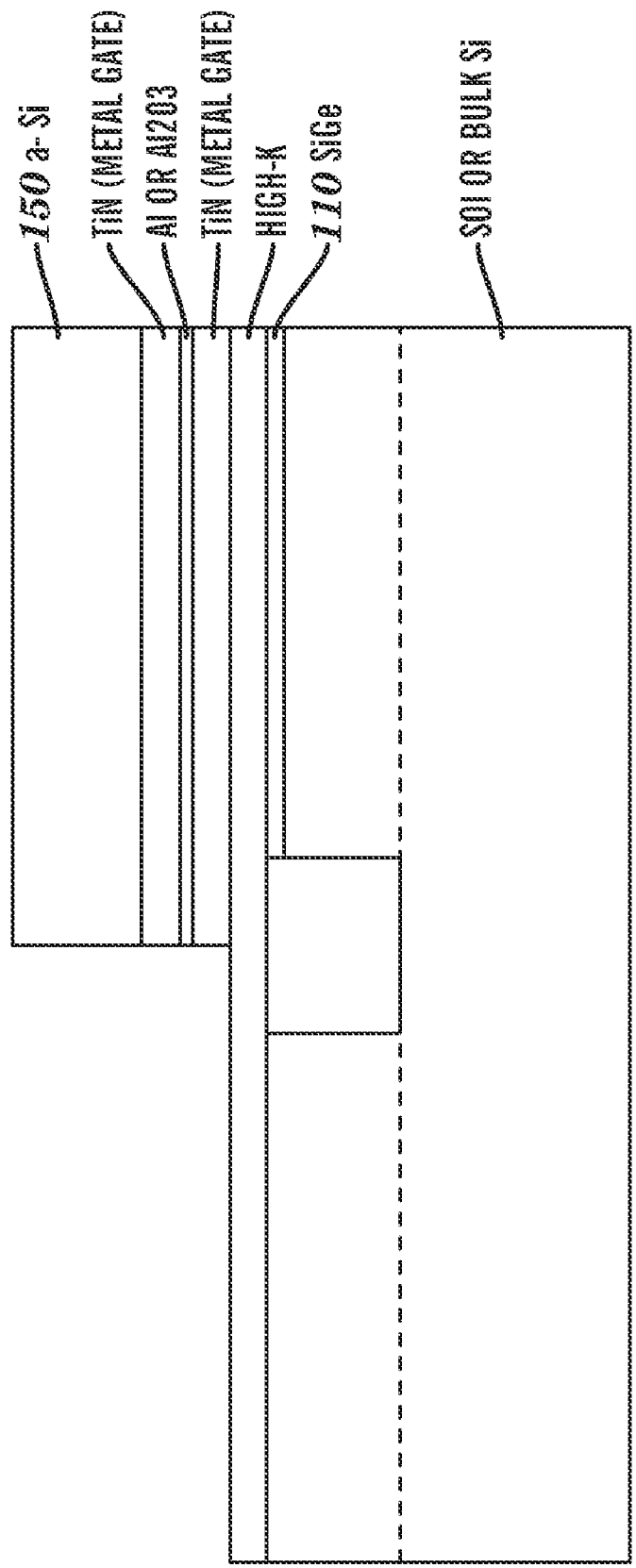

In FIG. 7, the layers 135, 140, 130 are removed from the NFET region by suitable wet etches such as Peroxide and Ammonium Hydroxide.

Figure 8:
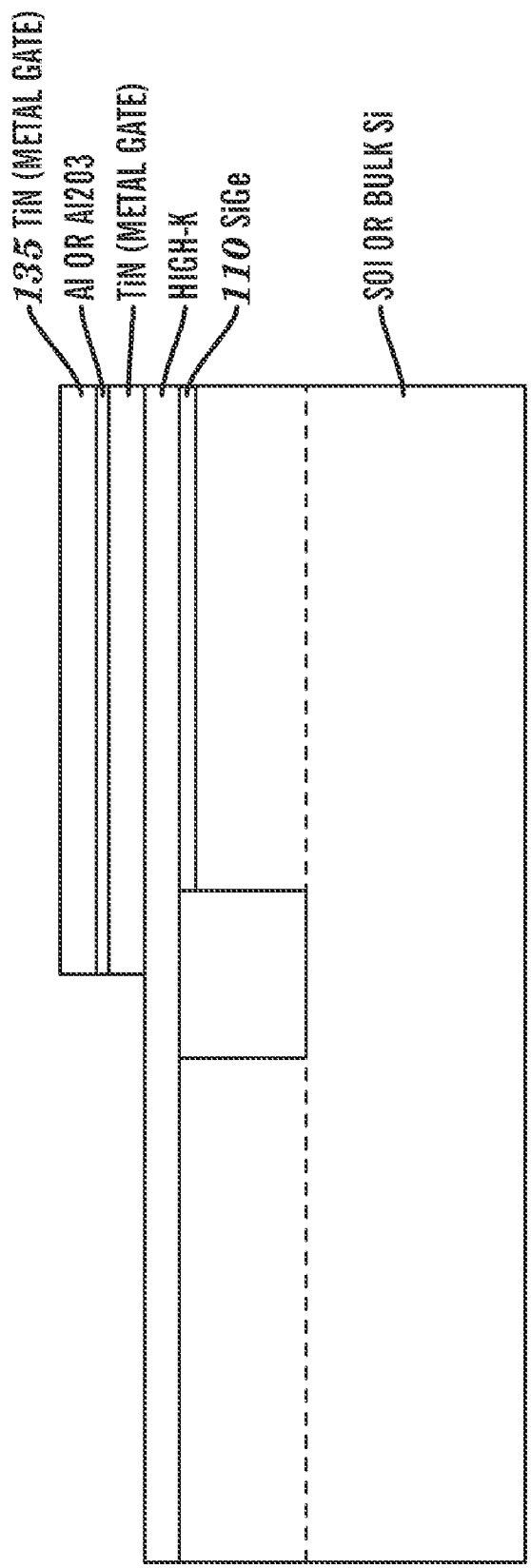

In FIG. 8, the layer 150 (e.g., a-Si) is removed from the PFET region to expose the metallic layer 135, by, for example, $NH_4OH$.

Figure 9:
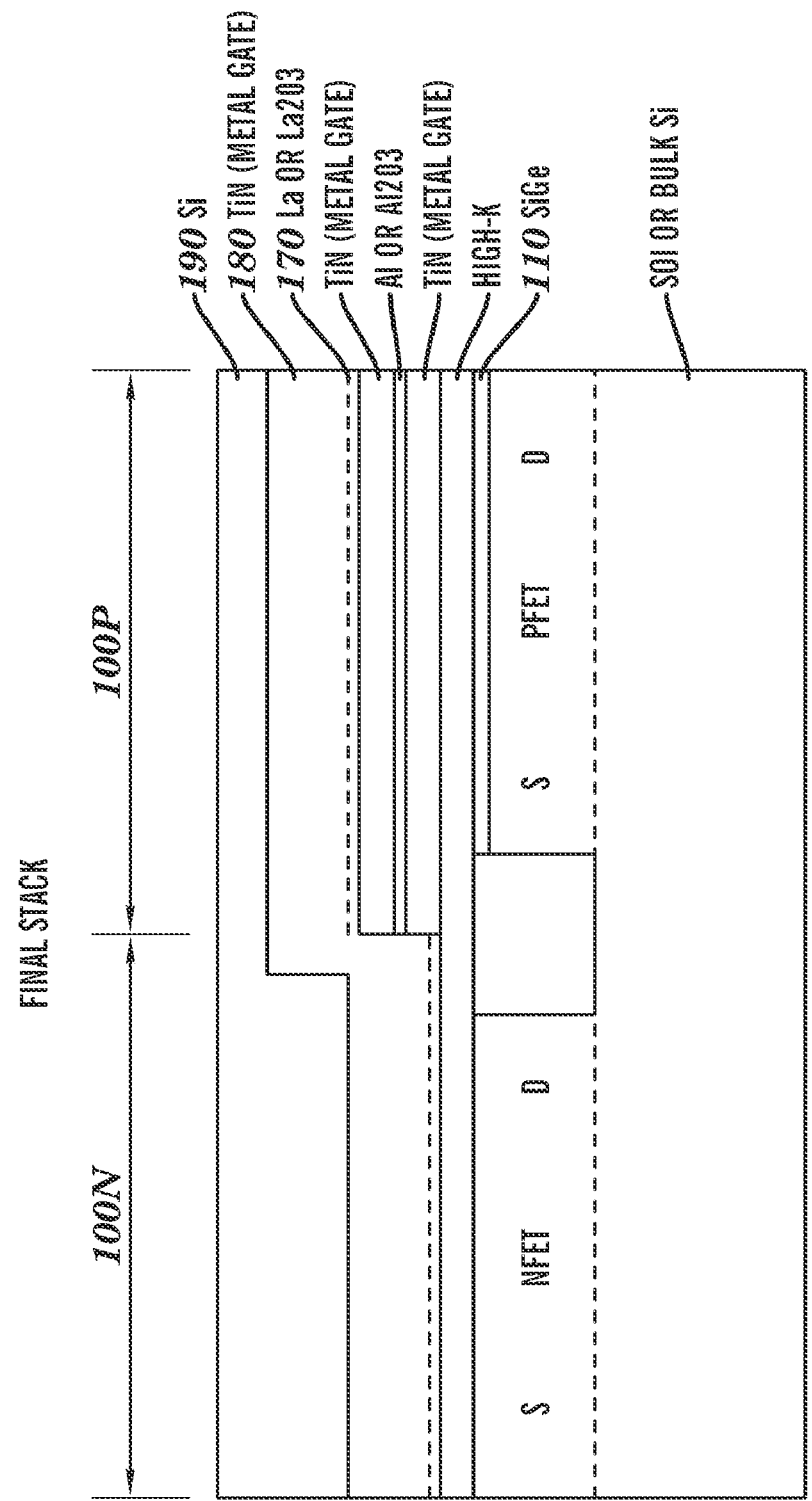

In FIG. 9, a second intermediate layer 170 is disposed onto the layers 120, 135, and then a third metallic layer 180 is deposited onto the layer 170. The layer 170 is, for example, La or $La_2O_3$, a combination of Group IIA or Group IIIB elements or their oxides, and the layer 180 is, for example, TiN, TaN, TaC, TaCN, TiN is preferred. Preferably, the La layer 170 has a substantially uniform thickness in a range from approximately one angstrom to approximately ten angstrom. The layer 180 has a substantially uniform thickness in a range of approximately five angstroms to approximately 100 angstroms.

A silicon layer 190 (amorphous or poly) is deposited, having a thickness of approximately 200 angstroms to 1000 angstroms, and preferably, about 300 angstroms to about 600 angstroms depending upon the process technology node.

Figure 2D:
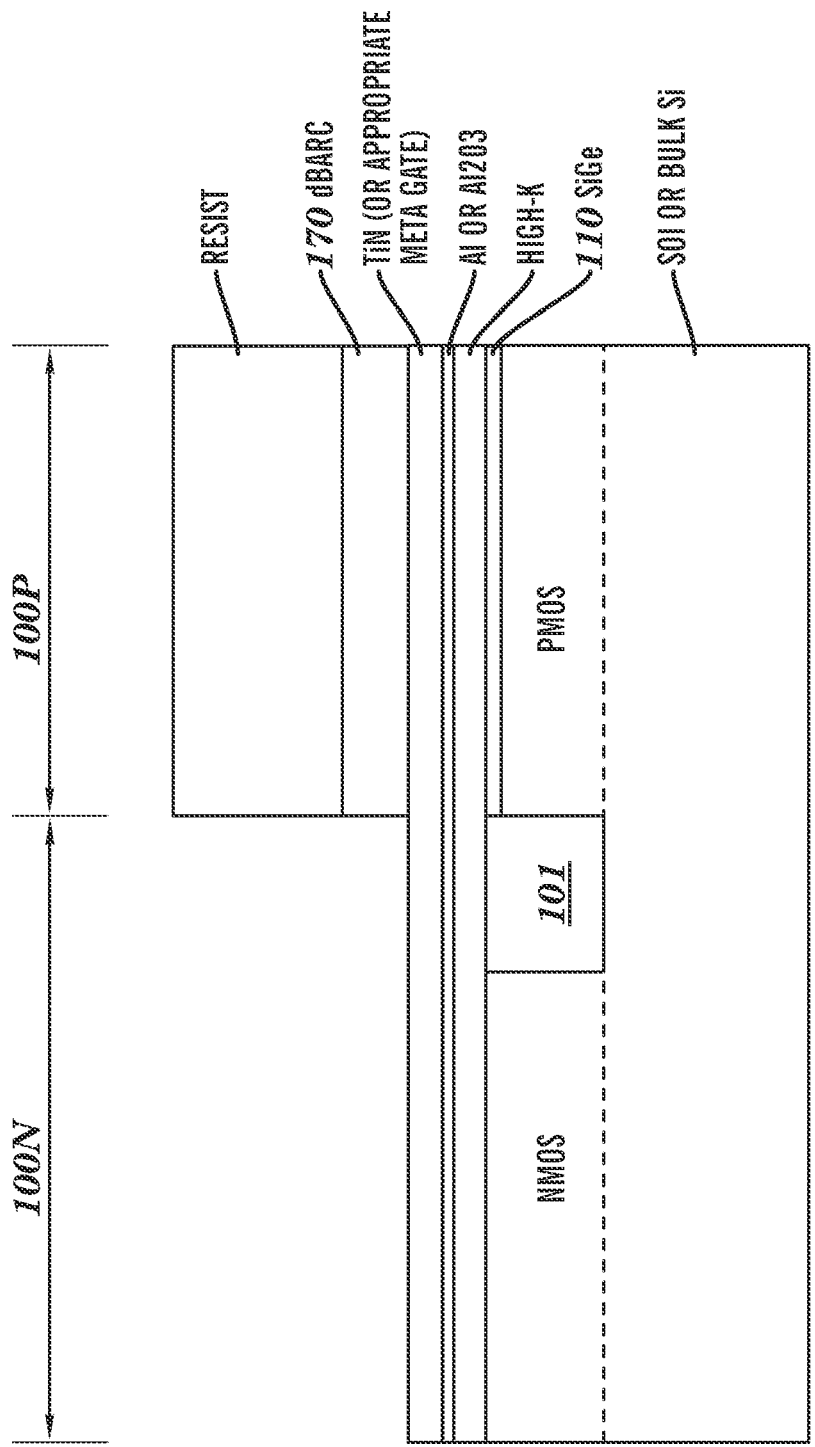
Figure 10:
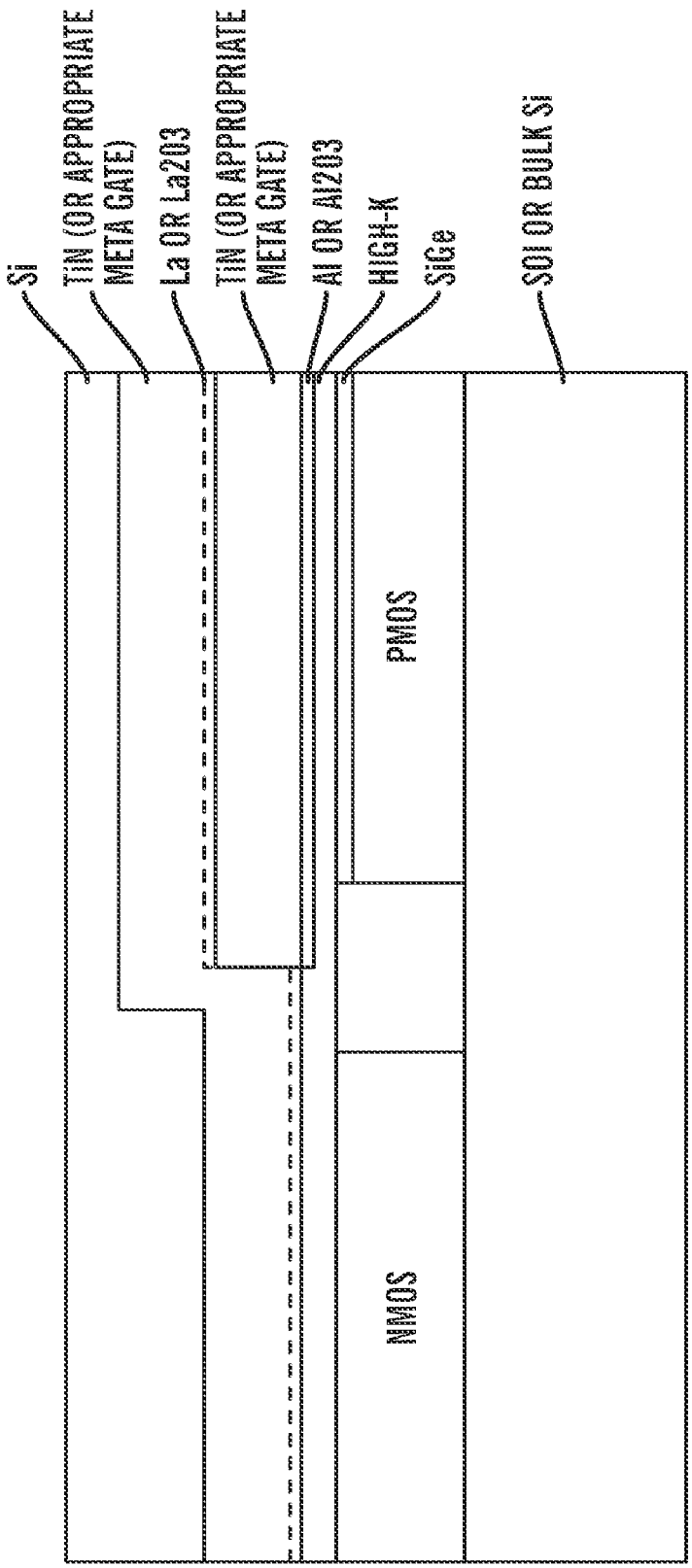
FIG. 10 is a side sectional schematic view of a particularly preferred embodiment of a semiconductor device according to the invention.

FIG. 10 shows an embodiment of a final stack according to the present invention, when the structure of FIG. 2D is utilized.

Conventional device patterning and processing (contact, vias) is then performed, which need not be discussed further.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed:

1. A semiconductor device, comprising:
   a PFET region including:
   a SiGe layer disposed on a substrate portion doped for the PFET,
   a high-K dielectric layer disposed on the SiGe layer,
   a first metallic layer disposed on the high-k dielectric layer,
   a first intermediate layer disposed on the first metallic layer,
   a second metallic layer disposed on the first intermediate layer,
   a second intermediate layer disposed on the second metallic layer; and
   a third metallic layer disposed on the second intermediate layer;
   an NFET region including:
   the high-k dielectric layer, the high-k dielectric layer being disposed on a substrate portion doped for the NFET,
   the second intermediate layer, the second intermediate layer being disposed on the high-k dielectric layer, and
   the third metallic layer, the third metallic layer being disposed on the second intermediate layer.

2. The device as claimed in claim 1, the high-k dielectric layer being a dielectric spacing material selected from the group consisting of hafnium oxide ($HFO_2$), aluminum oxide ($Al_2O_3$), lanthanum oxide ($La_2O_3$), hafnium silicon oxide (HfSiOx), hafnium silicon oxynitride (HfSiON), zirconium oxide (ZrO), zirconium silicon oxide (ZrSiO), yttrium oxide ($Y_2O_3$) strontium oxide (SrO), and strontium titanium oxide (SrTio), and mixtures thereof.

3. The device as claimed in claim 1, the first intermediate layer being a material selected from the group consisting of Al and $Al_2O_3$.

4. The device as claimed in claim 1, the first metallic layer consisting essentially of TiN.

5. The device as claimed in claim 1, the second metallic layer consisting essentially of TiN.

6. The device as claimed in claim 1, the second intermediate layer being a material selected from the group consisting of La and $La_2O_3$.

7. The device claimed in claim 1, the third metallic layer consists essentially of TiN.

8. The device claimed in claim 2, the high-k dielectric having a substantially uniform thickness in a range from approximately ten angstroms to approximately 35 angstroms.

9. The device as claimed in claim 3, the first intermediate layer having a substantially uniform thickness in a range from approximately three angstroms to approximately 20 angstroms.

10. The device as claimed in claim 4, the first metallic layer having a substantially uniform thickness in a range from approximately 15 angstroms to approximately 100 angstroms.

11. The device as claimed in claim 6, the second intermediate layer having a substantially uniform thickness in a range from approximately three angstroms to approximately 20 angstroms.

12. A semiconductor device, comprising:
   an NFET region and a PFET region disposed on semiconductor substrate, and
   an isolation region disposed between the NFET and the PFET;
   wherein the PFET region includes a gate stack, the gate stack comprising:
   a first TiN layer disposed on a high-k dielectric layer,
   an intermediate layer including aluminum being disposed on the TiN layer,
   a second TiN layer, the second TiN layer being disposed on the intermediate layer, and
   an $La_2O_3$ layer, the $La_2O_3$ layer being disposed on the second TiN layer.

13. The semiconductor device as claimed in claim 12, wherein the NFET includes a $La_2O_3$ layer disposed on the high-k dielectric layer.

14. A semiconductor device, comprising:
   a PFET region including:
   a SiGe layer disposed on a substrate portion doped for the PFET,
   a high-k dielectric layer disposed on the SiGe layer,
   a first intermediate layer including aluminum disposed on the high-k dielectric layer,
   a TiN layer disposed on the intermediate layer,
   a second intermediate layer including lanthanum disposed on the TiN layer, and
   another TiN layer disposed on the second intermediate layer;
   an NFET region including:
   the high-k dielectric layer, the high-k dielectric layer being disposed on a substrate portion doped for the NFET,
   the second intermediate layer, the second intermediate layer being disposed on the high-k dielectric layer, and
   an additional TiN layer, the additional TiN layer being disposed on the second intermediate layer.

* * * * *